US010615790B1

(12) United States Patent
Delshadpour et al.

(10) Patent No.: US 10,615,790 B1
(45) Date of Patent: Apr. 7, 2020

(54) TRANSISTOR BODY CONTROL

(71) Applicant: NXP B.V., Eindhoven (NL)

(72) Inventors: Siamak Delshadpour, Phoenix, AZ (US); Peter Christiaans, Mountain View, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/584,663

(22) Filed: Sep. 26, 2019

(51) Int. Cl.
*H03K 17/687* (2006.01)

(52) U.S. Cl.
CPC . *H03K 17/6871* (2013.01); *H03K 2217/0018* (2013.01); *H03K 2217/0027* (2013.01)

(58) Field of Classification Search
CPC .. H03K 17/063; H03K 17/066; H03K 17/687; H03K 17/04206; H03K 17/04106; H03K 2217/0018; H03K 2217/0027
See application file for complete search history.

(56) References Cited

U.S. PATENT DOCUMENTS

| 7,084,697 | B2* | 8/2006 | Kawagoshi | H02M 3/073 327/536 |
| 7,385,433 | B2* | 6/2008 | Callahan, Jr. | H03K 17/162 327/534 |
| 7,692,473 | B2* | 4/2010 | Ono | H01L 27/0255 327/303 |
| 8,344,789 | B2 | 1/2013 | Webb | |
| 9,264,034 | B2* | 2/2016 | Kim | H03K 17/063 |
| 9,379,702 | B2* | 6/2016 | Yang | H03K 17/6871 |
| 9,385,703 | B2* | 7/2016 | Kim | H03K 17/145 |
| 9,946,292 | B2* | 4/2018 | Wakimoto | G05F 5/00 |
| 10,056,787 | B2* | 8/2018 | Morikawa | H02J 7/007 |
| 10,115,818 | B1* | 10/2018 | Eggermont | H03K 17/063 |
| 10,348,296 | B2* | 7/2019 | Stefanov | H01L 29/7813 |
| 2011/0057715 | A1* | 3/2011 | Guo | H03K 17/04123 327/434 |
| 2014/0193003 | A1* | 7/2014 | Gagne | H03K 17/693 381/123 |

* cited by examiner

*Primary Examiner* — Thomas J. Hiltunen
(74) *Attorney, Agent, or Firm* — Rajeev Madnawat

(57) ABSTRACT

A circuit for controlling body biasing of a transistor is disclosed. The transistor includes a first terminal, a second terminal, a gate and a body terminal. The circuit includes a body control circuit coupled to the first terminal and the second terminal. The body control circuit is configured to connect the body terminal to ground when a voltage at the second terminal is less than a fix predefined voltage. The body control circuit is further configured to connect the body terminal to the second terminal when voltage at the first terminal is higher than voltage at the second terminal and the voltage at the second terminal is higher than the fix predefined voltage, and to connect the body terminal to the first terminal when the voltage at the first terminal is less than the voltage at the second terminal and the voltage at the first terminal is higher than the fix predefined voltage.

17 Claims, 4 Drawing Sheets

| SW 110 | | M0 | M1 | M2 | M3 | M4 | M5 |
|---|---|---|---|---|---|---|---|
| OFF | | ON | ON | OFF | OFF | ON | ON |
| ON | D>S, S>HV | OFF | OFF | OFF | ON | ON | OFF |
| ON | D<S, S>HV | OFF | OFF | ON | OFF | OFF | ON |
| ON | VS<HV | OFF | ON | OFF | OFF | ON | ON |
| OFF | VS<HV | ON | ON | OFF | OFF | ON | ON |

TRANSISTOR BODY CONTROL

BACKGROUND

Metal-oxide-semiconductor field-effect (MOSFET) transistors can tolerate a limited absolute maximum voltage level on drain, source, gate and body. Same applies to a maximum voltage difference on each two nodes (e.g., between the two of Source, Drain, Gate). Transistor body biasing can be used to ensure that the voltage difference between the two nodes is within tolerable limits. In general, the body of PMOS needs to be connected to highest available voltage in the chip and the body of NMOS is connected to lowest voltage.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a circuit for controlling body biasing of a transistor is disclosed. The transistor includes a first terminal, a second terminal, a gate and a body terminal. The circuit includes a body control circuit coupled to the first terminal and the second terminal. The body control circuit is configured to connect the body terminal to ground when a voltage at the second terminal is less than a fix predefined voltage. The body control circuit is further configured to connect the body terminal to the second terminal when voltage at the first terminal is higher than voltage at the second terminal and the voltage at the second terminal is higher than the fix predefined voltage, and to connect the body terminal to the first terminal when the voltage at the first terminal is less than the voltage at the second terminal and the voltage at the first terminal is higher than the fix predefined voltage.

In some examples, the circuit further includes a gate control circuit coupled to the gate of the transistor. The gate control circuit is configured to provide a gate voltage to the gate of the transistor such that a difference between the voltage at the first terminal and the gate voltage is less than or equal to the predefined voltage. The gate voltage is generated by adding a non-variable fix voltage to the greater of the voltage at the first terminal and the voltage at the second terminal. The gate control circuit includes a control transistor to couple the gate to the ground when the transistor is OFF.

In some embodiments, the body control circuit includes a first transistor that is coupled to the first terminal and a gate of the first transistor is driven by a body control voltage, wherein the body control voltage is generated by adding a non-variable fix voltage to the lesser of the voltage at the first terminal and the voltage at the second terminal. The body control circuit includes a second transistor that is coupled to the second terminal and a gate of the second transistor is driven by the body control voltage. The body control circuit includes a third transistor coupled to the first transistor and the second transistor and to the ground, wherein the third transistor is driven by a control signal that is generated based on ON/OFF status of the transistor and a voltage difference between the voltage at the second terminal and a fix voltage.

In some examples, the circuit further includes a first comparator circuit that is configured to output an indication that the voltage at the first terminal is higher than the voltage at the second terminal. The circuit may also include a second comparator circuit that is configured to output an indication that the voltage at the second terminal is higher than the fix predefined voltage.

In some embodiments, the fix predefined voltage is determined by electrical characteristics of the transistor. In some examples, the transistor can be a high voltage NMOS or a high voltage PMOS.

The body control circuit may further include a third transistor coupled to the ground on one end and to a voltage source on the other end, wherein the voltage source provides a voltage that is generated by adding a non-variable fix voltage to the lesser of the voltage at the first terminal and the voltage at the second terminal. The gate of the third transistor is driven by a first control signal that is generated based on a voltage difference between the voltage at the first terminal and the voltage at the second terminal and a difference between the voltage at the second terminal and a fix reference voltage.

The body control circuit may further include a forth transistor coupled to the ground on one end and to a voltage source on the other end, wherein the voltage source provides a voltage that is generated by adding a non-variable fix voltage to the lesser of the voltage at the first terminal and the voltage at the second terminal. The gate of the fourth transistor is driven by a second control signal that is generated based on a voltage difference between the voltage at the first terminal and the voltage at the second terminal and a difference between the voltage at the second terminal and a fix reference voltage, wherein the second control signal is different from the first control signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
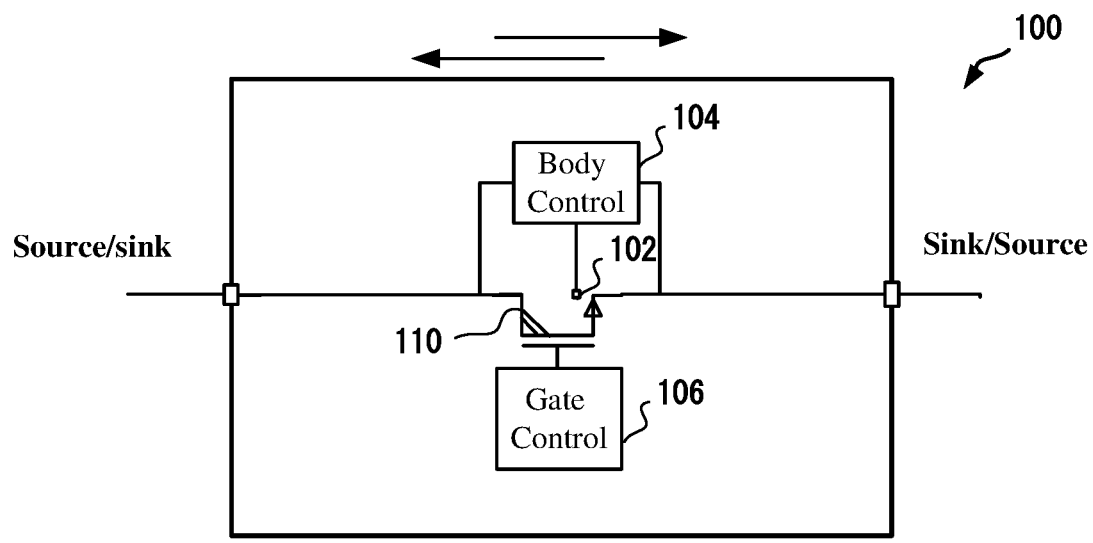
FIG. 1 depicts a transistor coupled with a gate control circuit and a body control circuit in accordance with one or more embodiments of the present disclosure.

Note that figures are not drawn to scale. Not all components in the chip are shown. The omitted components are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Body biasing may be used to protect a transistor in high voltage uses in which the voltage at a terminal of a transistor may exceed the maximum voltage for the transistor. Further, the threshold voltage of the transistor depends on the source-body voltage, having a body control to control body bias provides error free ON/OFF switching of the transistor.

Typically, in the case of NMOS, the body of the transistor may be tied to the lowest voltage (typically, the source) or to the ground. In low voltage operations (where the voltage at terminals or between the terminals remains below a threshold voltage), shorting the body to the ground may also be suffice. In the case of PMOS, the body can be shorted to the highest available voltage.

Embodiments described herein discloses one or more circuits for automatic body control of a transistor. The transistor may be used in uni-directional or bi-directional modes.

FIG. 1 shows a circuit 100 including a transistor 110 that is configured to be used in a bi-directional mode. The transistor includes a body 102. For the ease of discussion, the transistor 110 is NMOS. In some examples, the transistor 110 is a high voltage NMOS. However, a person skilled in the art will appreciate that the embodiments described herein can be equally applicable to PMOS type transistors. A high voltage transistor can tolerate higher voltage, e.g., up to 20V on its terminals or between two terminals as opposed to a low voltage transistor that can only tolerate a lower voltage, e.g., less than 8V. The circuit 100 also includes a body control circuit 104 coupled to the drain and the source of the transistor 110. A gate control circuit 106 is coupled to the gate of the transistor 110. The gate control circuit 106 provides a gate voltage higher than the threshold voltage of the transistor 110. The gate voltage is generated based on the voltage at the source and the drain of the transistor 110. The body control circuit 104 connects the body 102 to the drain or the source whichever has a lower voltage or to the ground. If the current is flowing from the left to the right (in FIG. 1), the voltage at the source/sink terminal will be higher than the sink/source terminal. The left side terminal will be a source and the right side terminal will be a sink. When the current is flowing from the right to the left, the left side terminal becomes a sink and the right side terminal becomes a source. The body control circuit 104 is configured to automatically detect the direction of the current flow and bias the body 102 as described herein.

Figure 2:
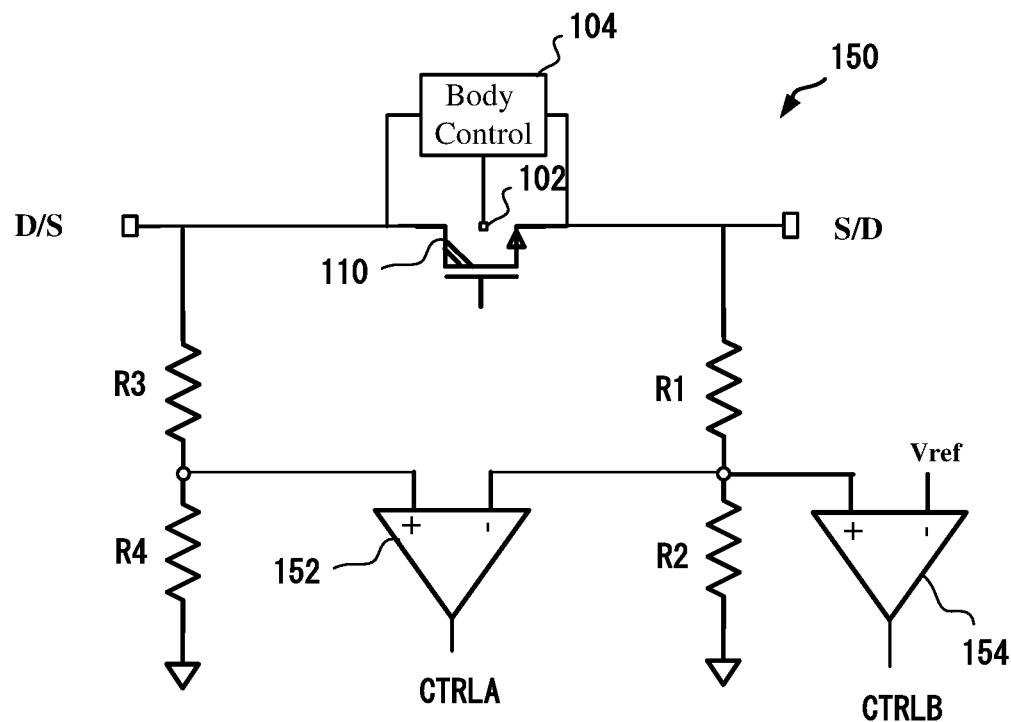
FIG. 2 depicts the generation of a control signals based on voltage differences between Drain, Source and a reference voltage in accordance with one or more embodiments of the present disclosure.

FIG. 2 shows a circuit 150 to generate a control signal to indicate if the drain voltage is higher than the source voltage. The first comparator 152 compares the voltage at D/S terminal (Drain/Source) drain and S/D terminal (Source/Drain) and output a signal (e.g., 0 or 1). D/S terminal is the drain when the current is flowing from D/S to S/D and the source when the current is flowing from S/D to D/S. The second comparator 156 compares the source voltage (i.e., at S/D terminal) with a fixed reference voltage Vref to generate a signal to indicate if the transistor 110 is being used in a low voltage mode or a high voltage mode. If the voltage at the source is above a present threshold, the transistor 110 is considered to be being used in a high voltage mode. The present threshold depends of the specification of the transistor 110. For example, the present threshold voltage may be 6.5V in some embodiments and for the ease of description, this value will be used as an example throughout this disclosure. The value of Vref may depend on the ratio of the resistors R1 and R2. The ratio of the resistors R3 and R4 may be the same as the ratio of the resistors R1 and R2. The reference voltage Vref may be generated using a bandgap circuit (not shown). Typically, the supply voltage to a circuit may vary, hence a bandgap circuit may be used to generate a fixed reference voltage from the supply voltage. The fixed reference voltage does not vary with the variations in the supply voltage. In this example, it is assumed that Vref is 1.25V. Assuming a maximum threshold voltage=6.5V, the scaling factor of the resistor R1 and R2=1.25V/6.5V.

When the transistor 110 is ON, the voltages at the drain and the source may be substantially the same. However, the first comparator 152 is configured to detect even the insubstantial difference and output 1 when the voltage at the drain is higher than the voltage at the source. In some embodiments, another comparator (not shown) may be used to detect if the transistor 110 is in ON state. Alternatively, a current sensor at the drain may be used to detect a current flow to detect if the transistor 110 is ON or OFF. The terminals "D/S" and "S/D" means that when the left side terminal is the drain, the right side terminal is the source and vice versa, depending on the direction of the current. The first comparator 152 produces a control signal CTRLA to indicate if the drain voltage is higher than the source voltage. The second comparator 154 produces a control signal CTRLB to indicate if the transistor 110 is being used in the low voltage mode or in the high voltage mode.

Figure 3A:
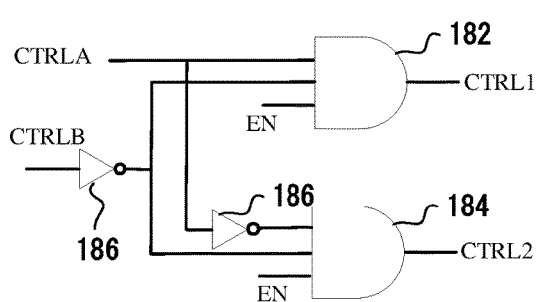
FIGS. 3A, 3B and 3C depict the generation of gate control signals in accordance with one or more embodiments of the present disclosure.

FIG. 3A discloses a circuit that includes a first AND gate 182 and a second AND gate 184 to produce gate control signals CTRL1 and CTRL2 based on control signals CTRLA and CTRLB. If CTRLA is high and CTRLB is low (indicating a high voltage mode), when the circuit enable signal EN is high, CTRL1 is high and CTRL2 is low. When CTRLA is low, CTRL1 is low and CTRL2 is high. When CTRLB is high (indicating a low voltage mode), both CTRL1 and CTRL2 are low.

Figure 3B:
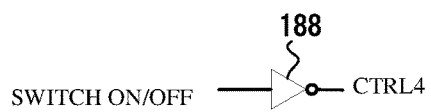

FIG. 3B shows a circuit to generate a gate control signal CTRL4. The circuit includes an inverter 188 to invert switch ON/OFF signal. For example, when the transistor 110 is OFF, CTRL4 is high and when the transistor 110 is ON, CTRL4 is low.

Figure 3C:
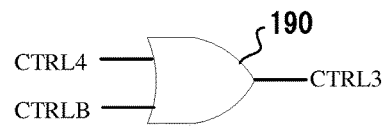

FIG. 3C shows a circuit to generate a gate control signal CTRL3 using an OR gate 190. CTRL3 is high when either or both CTRL4 and CTRLB are high. CTRL3 is low when both the inputs are low. It should be noted that FIG. 3A-C discloses sample implementations only, in practice the circuits shown in FIGS. 3A-3C may be implemented using other possible combinations of gates.

Figure 4:
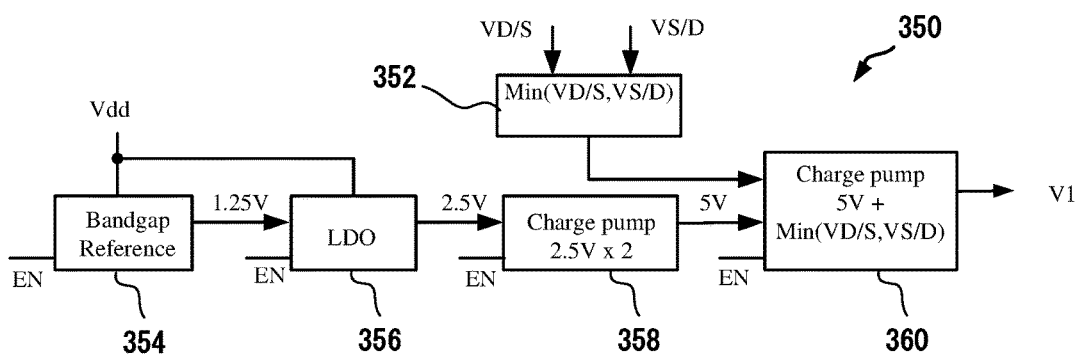
FIG. 4 shows a schematic of a circuit for generating a first reference voltage in accordance with one or more embodiments of the present disclosure.

FIG. 4 depicts a circuit 350 to produce a signal V1. V1 is equal to the sum of a preselected fixed voltage (e.g., 5V in this example) and the minimum of the drain voltage or the source voltage. The circuit 350 includes a reference voltage generator 354 that produces a first fixed reference voltage (1.25V in this example) from the supply voltage Vdd. The reference voltage generator 354 may be a bandgap circuit. The first fixed reference voltage is then multiplied by a low dropout regulator (LDO) 356 to produce a second fixed voltage (2.5V in this example). A charge pump 358 may used to further multiply the second fixed voltage by two to produce a third fixed voltage (5V in this example). The output of the charge pump 358 is added to the output of a drain source voltage comparator 352 that outputs the minimum of the source voltage and the drain voltage.

Figure 5:
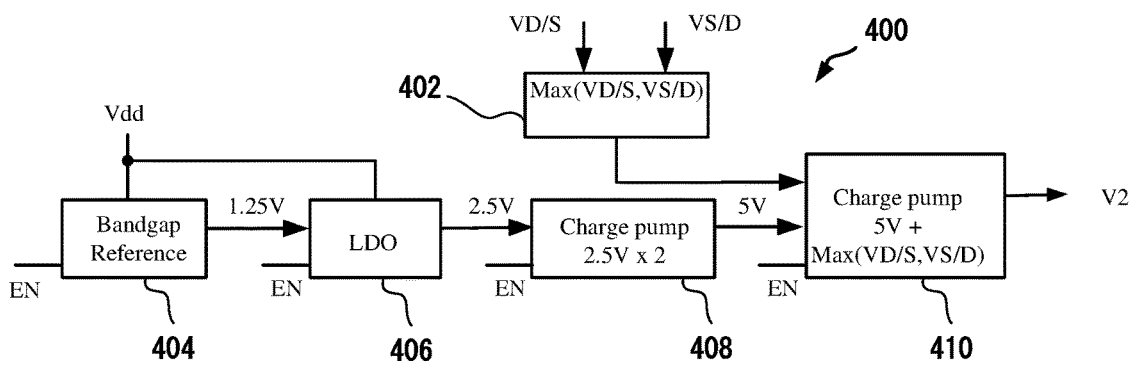
FIG. 5 shows a schematic of a circuit for generating a second reference voltage in accordance with one or more embodiments of the present disclosure.

FIG. 5 depicts a circuit 400 to produce a signal V2. V2 is equal to the sum of a fixed voltage (e.g., 5V in this example) and the maximum of the drain voltage or the source voltage. The circuit 400 includes a reference voltage generator 404 that produces a first fixed reference voltage (1.25V in this example) from the supply voltage Vdd. The reference voltage generator 404 may be a bandgap circuit. The first fixed reference voltage is then multiplied by a low dropout regulator (LDO) 406 to produce a second fixed voltage (2.5V in this example). A charge pump 408 may be used to further multiply the second fixed voltage by two to produce a third fixed voltage (5V in this example). The output of the charge pump 408 is added to the output of a drain source voltage comparator 402 that outputs the maximum of the source voltage and the drain voltage.

Figure 6:
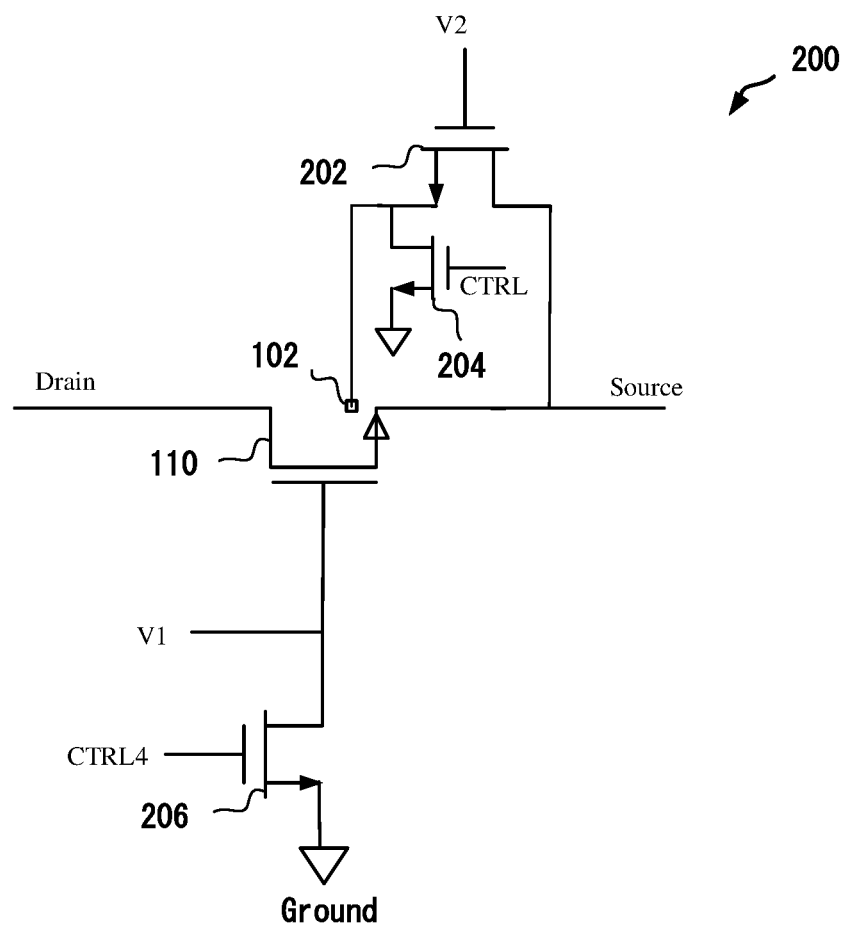
FIG. 6 depicts a uni-directional body control circuit coupled to a transistor in accordance with one or more embodiments of the present disclosure.

FIG. 6 shows a circuit 200 to bias the body 102 of the transistor 110. In this embodiment, the transistor 110 is configured to operate in a unidirectional mode. The circuit 200 includes a first control transistor 202, a second control transistor 204 and a third control transistor 206. The gate of the transistor 110 is coupled to a voltage source (e.g., the circuit 350) that outputs the voltage V1. When in the low voltage mode or when the transistor 110 is OFF, the control signal CTRL is high. Hence, the body 102 is coupled to the ground through the transistor 204. The control signal CTRL is high when the transistor 110 is OFF and low when the transistor 110 is ON. The drain voltage is higher than the source voltage in the uni-directional configuration. When CTRL is low and the voltage V2 (e.g., the output of the circuit 400) is applied to the gate of the transistor 202, the transistor 202 turns ON. If CTRL is low, the transistor 204 is OFF. Thus, the body 102 is coupled to the source voltage.

Figures 7, 8:
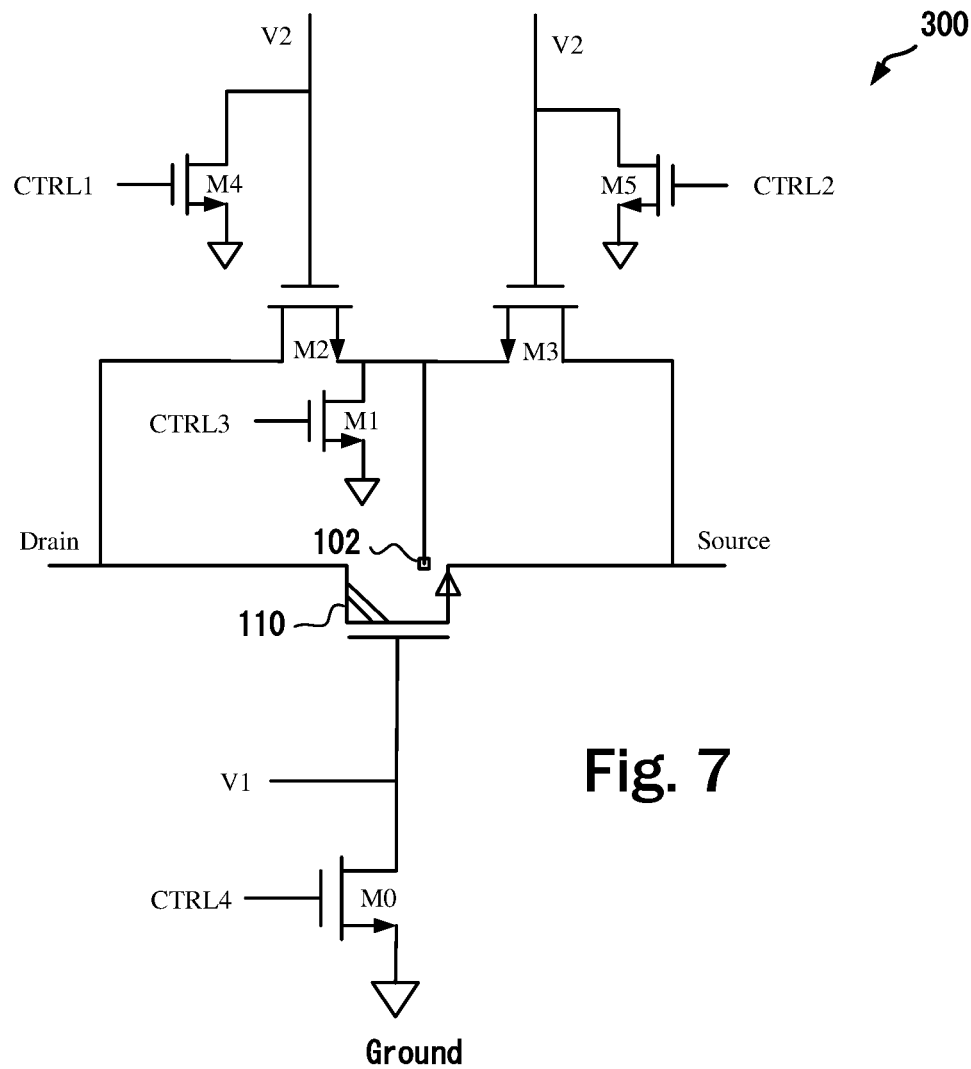
FIG. 7 shows a low/high voltage bi-directional body control circuit coupled to a transistor in accordance with one or more embodiments of the present disclosure.
FIG. 8 shows a switching table for the circuit in FIG. 7.

FIG. 7 shows a low/high voltage bi-directional body control circuit 300 coupled to the transistor 110. A low voltage mode is when a voltage at any of the terminals or between the two terminals of the transistor 110 is below a predefined voltage (HV). CTRL1, CTRL2, CTRL3 and CTRL4 are generated as explained above in FIGS. 3A-3C. CTRL1 drives the switch M4, CTRL2 drives the switch M5, CTRL3 drives the switch M1 and CTRL4 drives the switch M0. FIG. 8 shows a table 400 that tabulates the On/Off status of the switches M1, M2, M3, M4 and M5 under various conditions. Using voltages V1 and V2, the circuit 300 is configured such that in the high voltage mode, the voltage difference between any of the two terminals of the transistor 110 does not exceed HV to prevent stress and burn out of the transistor 110.

When the transistor 110 is OFF, the switches M0 and M1 are ON and the body 102 is grounded. When the transistor 110 is ON and the drain voltage of the transistor 110 is greater than the source voltage, and if the source voltage is above HV threshold (e.g., 6.5 V in some embodiments), the switches M0, M1, M2 and M5 are Off and the switched M3 and M4 are on, thus coupling the body 102 to the source. When the transistor 110 is ON and the drain voltage of the transistor 110 is less than the source voltage, and if the source voltage is above HV, the switches M0, M1, M3 and M4 are OFF and the switches M2 and M5 are ON, thus coupling the body 102 to the drain. When the transistor 110 is ON and the source voltage VS is less than HV, the body 102 is coupled to ground through the switch M1.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A circuit for controlling body biasing of a transistor, the transistor including a first terminal, a second terminal, a gate and a body terminal, the circuit comprising a body control circuit coupled to the first terminal and the second terminal, wherein the body control circuit is configured to connect the body terminal to ground when a voltage at the second terminal is less than a fix predefined voltage, wherein the body control circuit is further configured to connect the body terminal to the second terminal when voltage at the first terminal is higher than voltage at the second terminal and the voltage at the second terminal is higher than the fix predefined voltage, and to connect the body terminal to the first terminal when the voltage at the first terminal is less than the voltage at the second terminal and the voltage at the first terminal is higher than the fix predefined voltage.

2. The circuit of claim 1, further including a gate control circuit coupled to the gate of the transistor, wherein the gate control circuit is configured to provide a gate voltage to the gate of the transistor such that a difference between the voltage at the first terminal and the gate voltage is less than or equal to the predefined voltage.

3. The circuit of claim 2, wherein the gate control circuit is configured to connect the gate to the ground when the transistor is OFF.

4. The circuit of claim 2, wherein the gate voltage is generated by adding a non-variable fix voltage to the greater of the voltage at the first terminal and the voltage at the second terminal.

5. The circuit of claim 2, wherein the gate control circuit includes a control transistor to couple the gate to the ground when the transistor is OFF.

6. The circuit of claim 1, wherein the body control circuit includes a first transistor that is coupled to the first terminal and a gate of the first transistor is driven by a body control voltage, wherein the body control voltage is generated by adding a non-variable fix voltage to the lesser of the voltage at the first terminal and the voltage at the second terminal.

7. The circuit of claim 6, wherein the body control circuit includes a second transistor that is coupled to the second terminal and a gate of the second transistor is driven by the body control voltage.

8. The circuit of claim 7, wherein the body control circuit includes a third transistor coupled to the first transistor and the second transistor and to the ground, wherein the third transistor is driven by a control signal that is generated based on ON/OFF status of the transistor and a voltage difference between the voltage at the second terminal and a fix voltage.

9. The circuit of claim 1, further including a first comparator circuit that is configured to output an indication that the voltage at the first terminal is higher than the voltage at the second terminal.

10. The circuit of claim 1, further including a second comparator circuit that is configured to output an indication that the voltage at the second terminal is higher than the fix predefined voltage.

11. The circuit of claim 1, wherein the fix predefined voltage is determined by electrical characteristics of the transistor.

12. The circuit of claim 1, wherein the body control circuit further including a third transistor coupled to the ground on one end and to a voltage source on the other end, wherein the voltage source provides a voltage that is generated by adding a non-variable fix voltage to the lesser of the voltage at the first terminal and the voltage at the second terminal.

13. The circuit of claim 12, wherein a gate of the third transistor is driven by a first control signal that is generated based on a voltage difference between the voltage at the first terminal and the voltage at the second terminal and a difference between the voltage at the second terminal and a fix reference voltage.

14. The circuit of claim 13, wherein the body control circuit further including a forth transistor coupled to the ground on one end and to a voltage source on the other end, wherein the voltage source provides a voltage that is generated by adding a non-variable fix voltage to the lesser of the voltage at the first terminal and the voltage at the second terminal.

15. The circuit of claim 14, wherein a gate of the fourth transistor is driven by a second control signal that is generated based on a voltage difference between the voltage at the first terminal and the voltage at the second terminal and a difference between the voltage at the second terminal and a fix reference voltage, wherein the second control signal is different from the first control signal.

16. The circuit of claim 1, wherein the transistor is a high voltage NMOS transistor.

17. The circuit of claim 1, wherein the transistor is a high voltage PMOS transistor.

* * * * *